(12) United States Patent
Yoshizawa (10) Patent No.: US 9,278,850 B2
(45) Date of Patent: Mar. 8, 2016

(54) MEMS DEVICE AND METHOD OF MANUFACTURING THE SAME

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/642,031

(22) Filed: Mar. 9, 2015

(65) Prior Publication Data

US 2015/0266719 A1    Sep. 24, 2015

(30) Foreign Application Priority Data

Mar. 18, 2014  (JP) ................. 2014-055345

(51) Int. Cl.
*H01L 27/14* (2006.01)
*B81B 7/00* (2006.01)
*B81C 1/00* (2006.01)

(52) U.S. Cl.
CPC ............. *B81B 7/007* (2013.01); *B81C 1/00301* (2013.01)

(58) Field of Classification Search
CPC ................ B81B 7/007; B81C 1/00301; H01L 27/14689
USPC .............................................. 257/44; 438/48
See application file for complete search history.

(56) References Cited

U.S. PATENT DOCUMENTS

| | | | | |
|---|---|---|---|---|
| 5,929,497 | A | * | 7/1999 | Chavan et al. ................. 257/417 |
| 2005/0117271 | A1 | * | 6/2005 | De Samber et al. ........ 361/306.1 |
| 2008/0283943 | A1 | | 11/2008 | Dekker et al. |
| 2009/0108381 | A1 | * | 4/2009 | Buchwalter et al. .......... 257/415 |

FOREIGN PATENT DOCUMENTS

| | | |
|---|---|---|
| JP | 2008-100325 A | 5/2008 |
| JP | 2009-516346 A | 4/2009 |
| WO | 2007/057814 A2 | 5/2007 |

* cited by examiner

*Primary Examiner* — Fernando L Toledo
*Assistant Examiner* — Neil Prasad
(74) *Attorney, Agent, or Firm* — Oliff PLC (57) ABSTRACT

A present MEMS device includes: a semiconductor substrate in which a trench is formed; a functional element that is provided in the trench of the semiconductor substrate and includes a connection electrode; a structural member that forms a cavity surrounding the functional element; a lid portion that includes a conductive member electrically connected to the connection electrode and covers the cavity; an insulating layer that covers the main surface of the semiconductor substrate provided with the lid portion and a semiconductor circuit element; a first electrode that penetrates the insulating layer and is electrically connected to the conductive member; a second electrode that penetrates the insulating layer and is electrically connected to the semiconductor circuit element; and wiring that is provided on a surface of the insulating layer and brings the first electrode and the second electrode into electrical connection to each other.

4 Claims, 6 Drawing Sheets

MEMS DEVICE AND METHOD OF MANUFACTURING THE SAME

BACKGROUND

1. Technical Field

The present invention relates to, for example, a MEMS (Micro Electro Mechanical Systems) device in which a functional element, such as a resonator, a sensor and an actuator, and/or an electronic circuit are integrated on one substrate, and a method of manufacturing such a MEMS device.

2. Related Art

For example, in a MEMS device that includes a resonator with capacitance as a functional element, the resonator is airtightly sealed, in a vacuum state, in a cavity formed in a substrate. Also, even in the case of a functional element that does not require airtight vacuum seal, the functional element is airtightly sealed in a cavity so as to prevent the influences of dust, moisture, and the like.

Traditionally, in a case where such a functional element and a semiconductor circuit element are integrated on one semiconductor substrate, a cavity is formed by providing the functional element on the semiconductor substrate and surrounding the functional element with an insulating film and the like. Therefore, the cavity obstructs formation of wiring on the semiconductor substrate via an insulating layer.

In such a MEMS device, a special process, such as wire bonding or TSV (Through Silicon Via), is used to electrically connect the functional element to the semiconductor circuit element. In an alternative case where connection can be realized using a standard semiconductor wafer process, an enormous restriction is imposed on routing of wiring for electrically connecting the functional element to the semiconductor circuit element. As a result, electrical connection between the functional element and the semiconductor circuit element becomes complicated, thereby triggering a decrease in a degree of freedom of design of the MEMS device and an increase in cost.

As a related technique, JP-A-2008-100325 (paragraphs 0004 to 0006, FIG. 8) discloses a MEMS and semiconductor composite circuit that realizes a structure which facilitates planarization of a layer structure provided on a semiconductor substrate, and which is resistant to the inter-influences between an element structure of a semiconductor element portion and a MEMS structural member. In this MEMS and semiconductor composite circuit, a MEMS trench structure and a boundary trench structure are formed in a surface layer portion of a semiconductor substrate. The MEMS trench structure is composed of a surface recessed portion for achieving element isolation for a MEMS structural member with respect to the semiconductor substrate, and an insulating member installed inside the surface recessed portion. The boundary trench structure is composed of a surface groove that is provided in an element boundary portion for achieving element isolation for a semiconductor element portion, and an insulating member installed inside the surface groove. A surface of the insulating member in the MEMS trench structure is constructed to be lower than a substrate surface of the semiconductor substrate, and the MEMS structural member is formed on the surface of the insulating member.

On the other hand, JP-T-2009-516346 (abstract, claim 9, FIG. 1) discloses an electronic device that has a MEMS element in a cavity. This electronic device has a substrate of a semiconductor material with a first side and an opposite second side, and a MEMS element which is provided with a fixed electrode and a movable electrode. The movable electrode is formed in a closed cavity and is movable towards and from the fixed electrode between a first gapped position and a second position. The cavity is opened through etching holes in the substrate that are exposed on the second side of the substrate, the electrodes are coupled to contact pads on the first side, and a resin layer is present between the electrodes of the MEMS element and the contact pads. The substrate is provided with a packaging portion on the second side through which the etching holes extend, and the cavity is at least partially present between the movable electrode and the packaging portion.

JP-A-2008-100325 (paragraphs 0004 to 0006, FIG. 8) and JP-T-2009-516346 (abstract, claim 9, FIG. 1) are examples of related art.

JP-A-2008-100325 (paragraphs 0004 to 0006, FIG. 8) and JP-T-2009-516346 (abstract, claim 9, FIG. 1) disclose formation of a MEMS trench structure and a cavity in a semiconductor substrate, and provision of a MEMS element in the cavity. However, as the MEMS element extends in a region that is higher than a main surface of the substrate, a part of the cavity surrounding the MEMS element is formed in the region that is higher than the main surface of the substrate, thereby obstructing formation of wiring on the substrate via an insulating layer.

SUMMARY

An advantage of some aspects of the invention is that, in a MEMS device in which a functional element and a semiconductor circuit element are integrated on one semiconductor substrate, a degree of freedom of design of the MEMS device is improved by allowing a wiring layer to be installed, using a standard semiconductor wafer process, on a layer(s) above a cavity that houses the functional element, similarly to a layer(s) above the semiconductor circuit element.

A MEMS device according to an aspect of the invention includes: a semiconductor substrate whose main surface has a first region in which a trench is formed and a second region in which an impurity diffusion region of a semiconductor circuit element is formed; a functional element that is provided in the trench of the semiconductor substrate and includes a connection electrode; a structural member that is provided in the trench of the semiconductor substrate and forms a cavity surrounding the functional element; a lid portion that includes a conductive member electrically connected to the connection electrode and covers the cavity, the conductive member being insulated from another part of the lid portion; an insulating layer that covers the main surface of the semiconductor substrate provided with the lid portion and the semiconductor circuit element; a first electrode that penetrates the insulating layer and is electrically connected to the conductive member; a second electrode that penetrates the insulating layer and is electrically connected to the semiconductor circuit element; and wiring that is provided on a surface of the insulating layer and brings the first electrode and the second electrode into electrical connection to each other.

Also, a method of manufacturing a MEMS device according to an aspect of the invention includes: (a) forming a trench in a first region of a main surface of a semiconductor substrate; (b) forming a functional element and a structural member in the trench of the semiconductor substrate, the functional element including a connection electrode, and the structural member forming a cavity surrounding the functional element; (c) forming a sacrificial film in the cavity; (d) forming a first lid portion in which an opening is formed and which covers a part of the cavity; (e) forming a semiconductor circuit element in a second region of the main surface of the semiconductor substrate; (f) removing the sacrificial film in the cavity through release etching; (g) forming, on a surface of the first lid portion, a second lid portion that includes a conductive member electrically connected to the connection electrode, the conductive member being insulated from another part of the second lid portion; (h) forming an insulating layer that covers the main surface of the semiconductor substrate on which the first lid portion, the second lid portion and the semiconductor circuit element are formed; (i) forming a first electrode and a second electrode, the first electrode penetrating the insulating layer and being electrically connected to the conductive member, and the second electrode penetrating the insulating layer and being electrically connected to the semiconductor circuit element; and (j) forming, on a surface of the insulating layer, wiring that brings the first electrode and the second electrode into electrical connection to each other.

According to an aspect of the invention, the main surface of the semiconductor substrate has the first region in which the trench is formed and the second region in which the impurity diffusion region of the semiconductor circuit element is formed, and the cavity is formed in the trench of the semiconductor substrate. The functional element is provided in the cavity, and the conductive member that is electrically connected to the connection electrode of the functional element is provided in the lid portion that covers the cavity. In this way, the height of an upper end of the first electrode that is electrically connected to the conductive member can be aligned with the height of an upper end of the second electrode that is electrically connected to the semiconductor circuit element. Therefore, a wiring layer can be installed, using a standard semiconductor wafer process, on a layer(s) above the cavity that houses the functional element, similarly to a layer(s) above the semiconductor circuit element. Accordingly, a degree of freedom of design of the MEMS device is improved.

Here, it is preferable that the surface of the insulating layer be treated by CMP (Chemical Mechanical Polishing). In this way, the surface of the insulating layer is planarized, and formation of wiring on the insulating layer is made easy. It is also preferable that, in the trench of the semiconductor substrate, the functional element and the structural member be provided in a region that is lower than the main surface of the semiconductor substrate. In this way, the cavity is formed in the region that is lower than the main surface of the semiconductor substrate, thereby allowing the lid portion to have a thickness sufficient to maintain the inside of the cavity in high vacuum.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes an embodiment of the invention in detail with reference to the accompanying drawings. It should be noted that the same constituent element is assigned the same reference sign, and redundant descriptions are omitted.

A MEMS device according to the embodiment of the invention is a device in which a functional element, such as a resonator, a sensor and an actuator, and an electronic circuit are integrated on one substrate.

Below, as one example, a MEMS device will be described that includes a resonator with capacitance as a functional element, and also includes a MOS field-effect transistor as a semiconductor circuit element. The resonator is airtightly sealed in a cavity formed in a trench (a recessed portion in a surface) of a semiconductor substrate.

Figure 1:
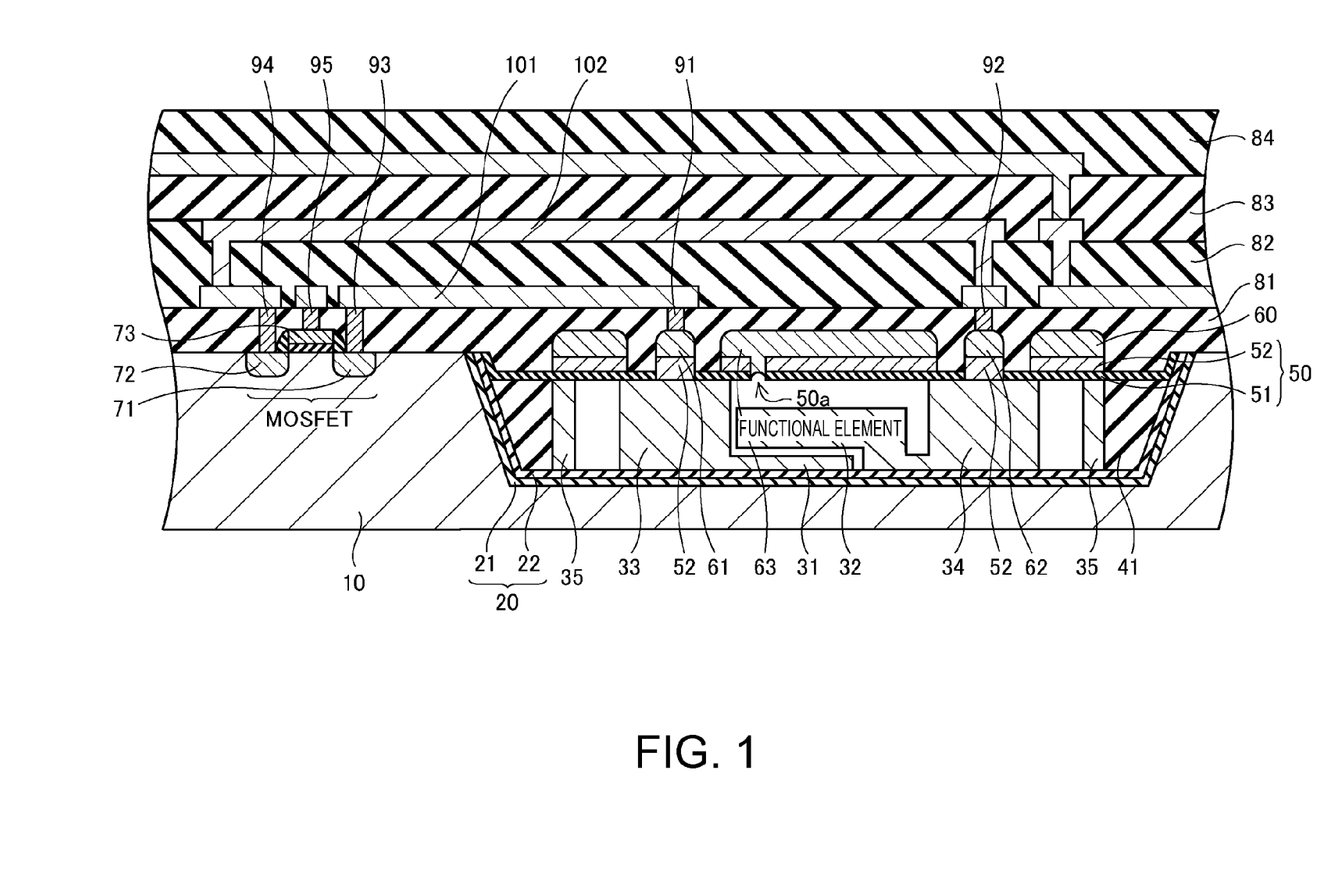
FIG. 1 is a cross-sectional view showing major portions of a MEMS device according to an embodiment of the invention.

FIG. 1 is a cross-sectional view showing major portions of a MEMS device according to the embodiment of the invention. As shown in FIG. 1, this MEMS device uses a semiconductor substrate 10 whose main surface (an upper surface in the figure) has a first region (the right side in the figure) in which a trench is formed and a second region (the left side in the figure) in which impurity diffusion regions of a semiconductor circuit element are formed.

A resonator including external connection electrodes, as well as a structural member that forms a cavity surrounding the resonator, is provided in the trench of the semiconductor substrate 10. For example, the resonator includes a lower electrode 31, an upper electrode 32 and external connection electrodes 33 and 34 that are provided on a bottom surface of the trench of the semiconductor substrate 10 via an insulating film 20. A wall portion 35, which is a structural member that forms the cavity, and an insulating film 41 for reinforcing the wall portion 35 are provided so as to surround these electrodes.

For example, the insulating film 20 includes an insulating film 21 of silicon dioxide ($SiO_2$) and an insulating film 22 of silicon nitride (SiN). The lower electrode 31 to the wall portion 35 are formed of, for example, polysilicon that has been doped with impurities and has electrical conductivity. The insulating film 41 is formed of silicon dioxide ($SiO_2$) and the like.

The upper electrode 32 of the resonator includes a cantilever-like structural member that is fixed at one end and movable at the other end. The external connection electrodes 33 and 34 have, for example, a shape of a prism or a cylinder. The external connection electrode 33 is electrically connected to the lower electrode 31, and may be constructed integrally with the lower electrode 31. The external connection electrode 34 is electrically connected to the upper electrode 32, and may be constructed integrally with the upper electrode 32.

In the trench of the semiconductor substrate 10, a region surrounded by the wall portion 35 is the cavity. The space in the cavity is a high vacuum region. By applying an alternating current voltage between the lower electrode 31 and the upper electrode 32 in the resonator provided in the cavity, mechanical oscillation of the upper electrode 32 is excited by an electrostatic force, and a change in capacitance between the lower electrode 31 and the upper electrode 32 attributed to this mechanical oscillation is detected.

The cavity is covered by a lid portion including a first lid portion 50 and a second lid portion 60. The first lid portion 50 includes, for example, an insulating film 51 of silicon nitride (SiN) and the like, and a polysilicon film 52 that has electrical conductivity. It should be noted that a surface of the polysilicon film 52 may be provided with a titanium nitride (TiN) film, a salicide film, or the like.

A part of the polysilicon film 52 is provided in a predetermined region of a main surface (an upper surface in the figure) of the external connection electrode 33, and is electrically connected to the external connection electrode 33. Another part of the polysilicon film 52 is provided in a predetermined region of a main surface (an upper surface in the figure) of the external connection electrode 34, and is electrically connected to the external connection electrode 34.

An opening (release hole) 50a is formed in the first lid portion 50. The part of the first lid portion 50 other than the opening 50a covers the cavity. With the inside of the cavity placed in a decompressed state (vacuum state), the second lid portion 60 is formed on a surface of the first lid portion 50 by aluminum (Al) and the like.

The second lid portion 60 includes an intermediate conductive member 61, an intermediate conductive member 62 and a sealing portion 63. The intermediate conductive member 61 is electrically connected to the external connection electrode 33 via the polysilicon film 52 and insulated from the other part of the second lid portion 60. The intermediate conductive member 62 is electrically connected to the external connection electrode 34 via the polysilicon film 52 and insulated from the other part of the second lid portion 60. The sealing portion 63 seals the opening 50a of the first lid portion.

Here, it is preferable that, in the trench of the semiconductor substrate 10, the lower electrode 31 to the external connection electrode 34 of the resonator and the wall portion 35, which is the structural member that forms the cavity surrounding the resonator, be provided in a region that is lower than the main surface of the semiconductor substrate 10. In this way, the cavity is formed in the region that is lower than the main surface of the semiconductor substrate 10, thereby allowing the lid portion to have a thickness sufficient to maintain the inside of the cavity in high vacuum.

Meanwhile, the semiconductor circuit element is provided in the second region of the main surface of the semiconductor substrate 10. For example, impurity diffusion regions 71 and 72, which serve as a source and a drain of a MOS field-effect transistor (MOSFET), are provided inside the semiconductor substrate 10, and a gate electrode 73 is provided on the semiconductor substrate 10 via a gate insulating film.

A first insulating layer (inter-layer insulating film) 81 of silicon dioxide ($SiO_2$), BPSG (Boron Phosphorus Silicon Glass), or the like is provided on the semiconductor substrate 10 provided with the lid portion and the semiconductor circuit element. The first insulating layer 81 covers the main surface of the semiconductor substrate 10. The first insulating layer 81 is in contact with the insulating film 51 and insulates the intermediate conductive members 61 and 62 of the second lid portion 60 from the sealing portion 63.

Here, it is preferable that a surface of the first insulating layer 81 be treated by CMP (Chemical Mechanical Polishing). In this way, the surface of the first insulating layer 81 is planarized, and formation of wiring on the first insulating layer 81 is made easy.

Contact plugs (electrodes) 91 and 92 of tungsten (W) and the like are provided in a first region of the first insulating layer 81. The contact plugs 91 and 92 penetrate the first insulating layer 81 and are electrically connected to the intermediate conductive members 61 and 62, respectively. Also, contact plugs (electrodes) 93 to 95 of tungsten (W) and the like are provided in a second region of the first insulating layer 81. The contact plugs 93 to 95 penetrate the first insulating layer 81 and are electrically connected to the impurity diffusion region 71, the impurity diffusion region 72 and the gate electrode 73, respectively.

Electrical connection to the contact plugs 91 to 95 is implemented on a first wiring layer of aluminum (Al) and the like, which is provided on a surface of the first insulating layer 81. Furthermore, where necessary, a second wiring layer is provided via a second insulating layer 82, and a third wiring layer is provided via a third insulating layer 83. In addition, a protection film 84 is provided on a surface of a topmost wiring layer.

For example, wiring 101 provided on the first wiring layer brings the contact plug 91 and the contact plug 93 into electrical connection to each other. Also, wiring 102 provided on the second wiring layer brings the contact plug 92 and the contact plug 94 into electrical connection to each other via the first wiring layer. In this way, the external connection electrodes 33 and 34 of the resonator can be electrically connected to the semiconductor circuit element.

According to the embodiment of the invention, the main surface of the semiconductor substrate 10 has the first region in which the trench is formed and the second region in which the impurity diffusion regions of the semiconductor circuit element are formed, and the cavity is formed in the trench of the semiconductor substrate 10. The functional element is provided in the cavity, and the intermediate conductive members 61 and 62 that are electrically connected to the external connection electrodes 33 and 34 of the functional element, respectively, are provided in the lid portion that covers the cavity.

In this way, the height of upper ends of the contact plugs 91 and 92 that are electrically connected to the intermediate conductive members 61 and 62, respectively, can be aligned with the height of upper ends of the contact plugs 93 to 95 that are electrically connected to the semiconductor circuit element. Therefore, a wiring layer can be installed, using a standard semiconductor wafer process, on a layer(s) above the cavity that houses the functional element, similarly to a layer(s) above the semiconductor circuit element. Accordingly, a degree of freedom of design of the MEMS device is improved.

A description is now given of a method of manufacturing the MEMS device shown in FIG. 1.

Figure 2A:
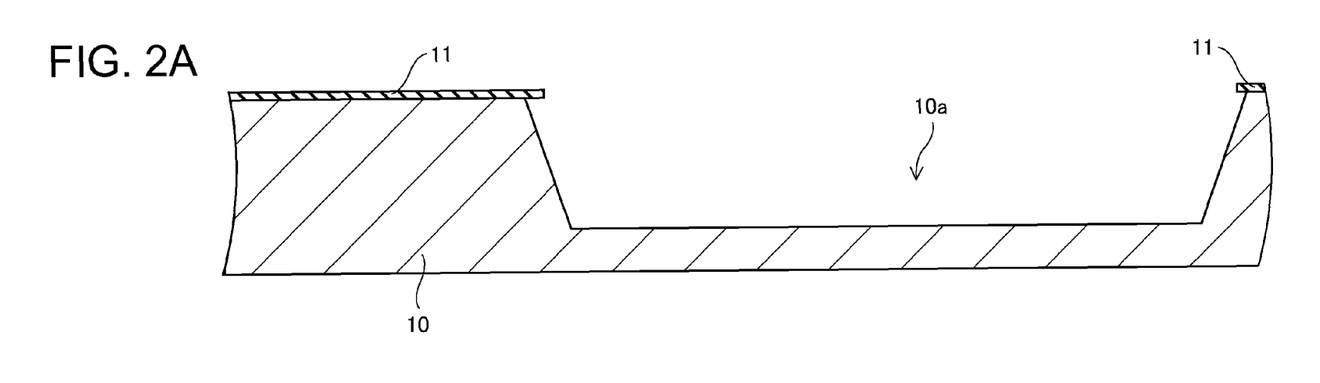
FIGS. 2A and 2B are cross-sectional views pertaining to manufacturing processes of the MEMS device according to the embodiment of the invention.

FIGS. 2A to 6B are cross-sectional views pertaining to manufacturing processes of the MEMS device according to the embodiment of the invention. First, for example, by providing a resist 11 using a photolithography technique and applying dry etching to a part of the main surface of the semiconductor substrate 10 constructed from a silicon monocrystal and the like, a deep trench 10a is formed in the first region of the main surface of the semiconductor substrate 10 as shown in FIG. 2A. Thereafter, the resist 11 is removed.

Figure 2B:
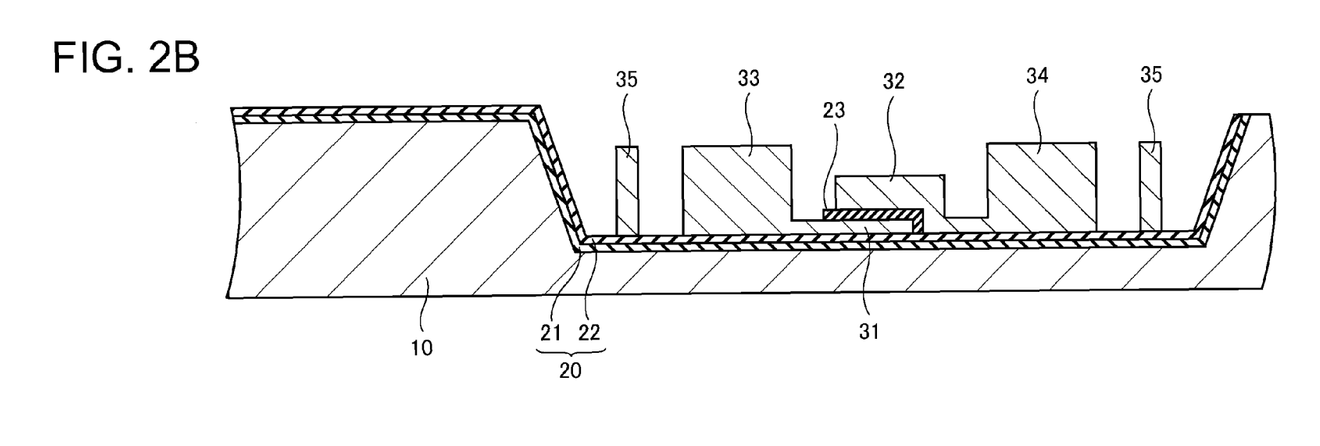

Next, as shown in FIG. 2B, the insulating film 20 is formed on a bottom surface of the trench of the semiconductor substrate 10. For example, the insulating film 20 includes the insulating film 21 of silicon dioxide ($SiO_2$) and the insulating film 22 of silicon nitride (SiN). The insulating film 22 of silicon nitride (SiN) withstands wet etching (release etching) for removing a later-described sacrificial film in the cavity.

Also, for example, polysilicon that has been doped with impurities and has electrical conductivity is formed on the bottom surface of the trench of the semiconductor substrate 10 via the insulating film 20, and patterning is applied through dry etching that uses a resist. Consequently, the lower electrode 31 of the resonator is formed. Furthermore, after forming a gap sacrificial film 23 on the lower electrode 31, for example, polysilicon that has electrical conductivity is formed, and patterning is applied through dry etching that uses a resist. Consequently, the upper electrode 32 and the external connection electrodes 33 and 34 of the resonator, as well as the wall portion 35, are formed. Thereafter, the gap sacrificial film 23 is removed through wet etching.

In this way, the resonator including the lower electrode 31, the upper electrode 32 and the external connection electrodes 33 and 34, as well as the wall portion 35, which is the structural member that forms the cavity surrounding the resonator, is formed in the trench of the semiconductor substrate 10.

Figure 3A:
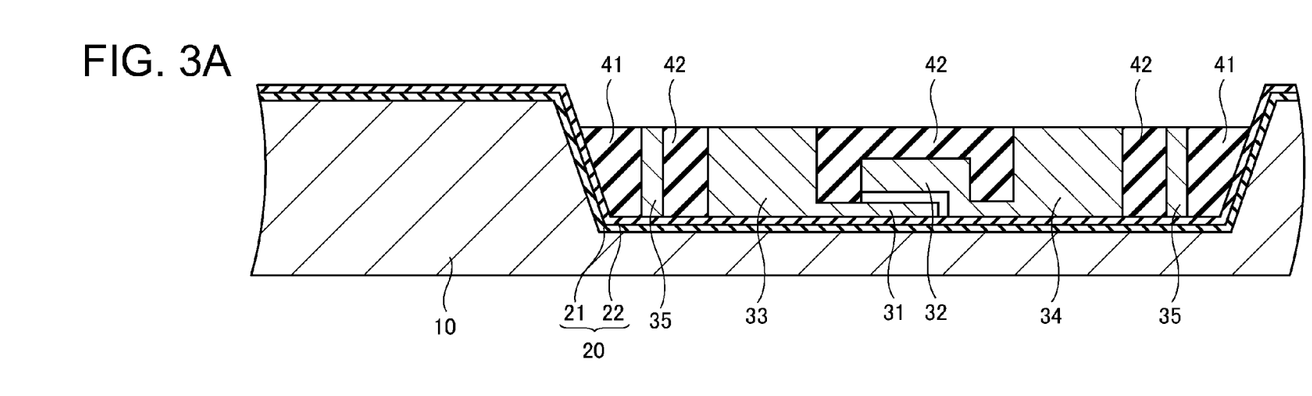
FIGS. 3A and 3B are cross-sectional views pertaining to manufacturing processes of the MEMS device according to the embodiment of the invention.

Next, after an insulating film of silicon dioxide ($SiO_2$) and the like is deposited, using a plasma CVD technique, on the surface of the semiconductor substrate 10 on which the resonator and the like are formed, the insulating film of silicon dioxide ($SiO_2$) and the like is polished by CMP (Chemical Mechanical Polishing) and further etched. As a result, as shown in FIG. 3A, the insulating film 41 of silicon dioxide ($SiO_2$) and the like is formed so as to surround the wall portion 35 in the trench of the semiconductor substrate 10, and an insulating film 42 of silicon dioxide ($SiO_2$) and the like is formed as a sacrificial film in the cavity.

Figure 3B:
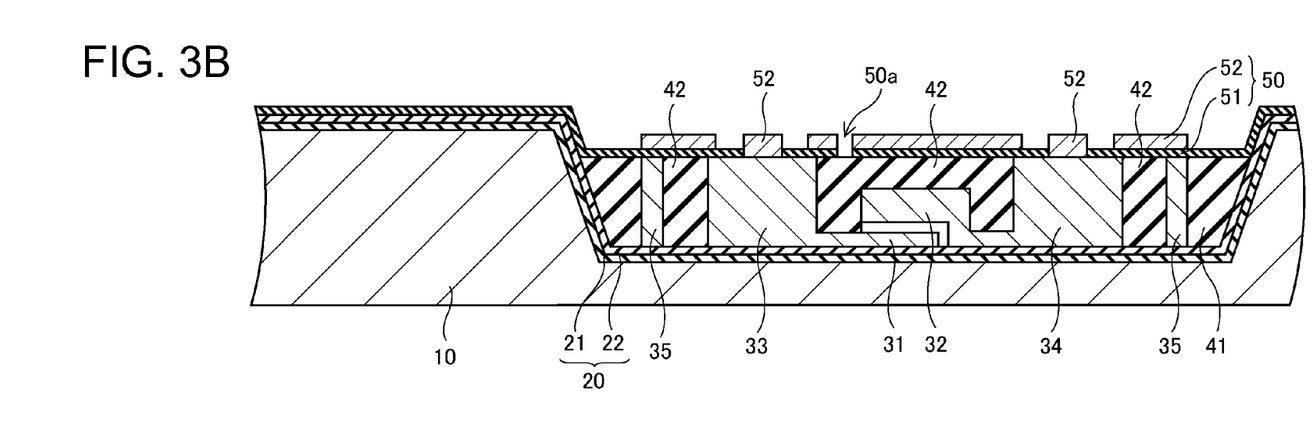

Next, after an insulating film of silicon nitride (SiN) and the like is formed on the surface of the semiconductor substrate 10 on which the insulating films 41 and 42 and the like are formed, patterning is applied to the insulating film of silicon nitride (SiN) and the like through dry etching that uses a resist. As a result, as shown in FIG. 3B, the insulating film 51 of silicon nitride (SiN) and the like, which covers parts of the main surfaces of the external connection electrodes 33 and 34 and parts of the insulating films 41 and 42, is formed.

Also, after a polysilicon film that has electrical conductivity is formed on the surface of the semiconductor substrate 10 on which the insulating film 51 and the like are formed, patterning is applied to the polysilicon film through dry etching that uses a resist. As a result, as shown in FIG. 3B, the first lid portion 50 including the insulating film 51 and the polysilicon film 52 is formed. The opening 50a is formed in the first lid portion 50. The part of the first lid portion 50 other than the opening 50a covers the cavity.

Here, a part of the polysilicon film 52 is provided in the predetermined region of the main surface of the external connection electrode 33, and is electrically connected to the external connection electrode 33. Another part of the polysilicon film 52 is provided in the predetermined region of the main surface of the external connection electrode 34, and is electrically connected to the external connection electrode 34.

Figure 4A:
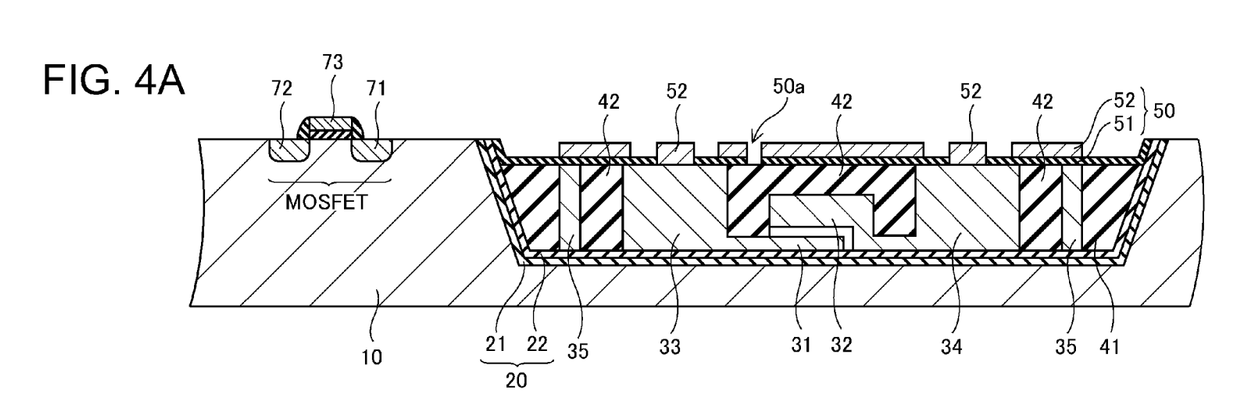
FIGS. 4A and 4B are cross-sectional views pertaining to manufacturing processes of the MEMS device according to the embodiment of the invention.

Next, insulating film planarization and the like are applied to the surface of the semiconductor substrate 10 on which the first lid portion 50 and the like are formed. Thereafter, for example, a MOS field-effect transistor (MOSFET) is formed as a semiconductor circuit element in the second region of the main surface of the semiconductor substrate 10 as shown in FIG. 4A.

That is to say, the gate electrode 73 is formed on the semiconductor substrate 10 via the gate insulating film, and the impurity diffusion regions 71 and 72 that serve as the source and the drain are formed inside the semiconductor substrate 10 on both sides of the gate electrode 73. Also, insulating side walls may be formed on side walls of the gate insulating film and the gate electrode 73. Furthermore, an insulating film of a predetermined thickness may be formed in a region surrounding the insulating side walls.

Figure 4B:
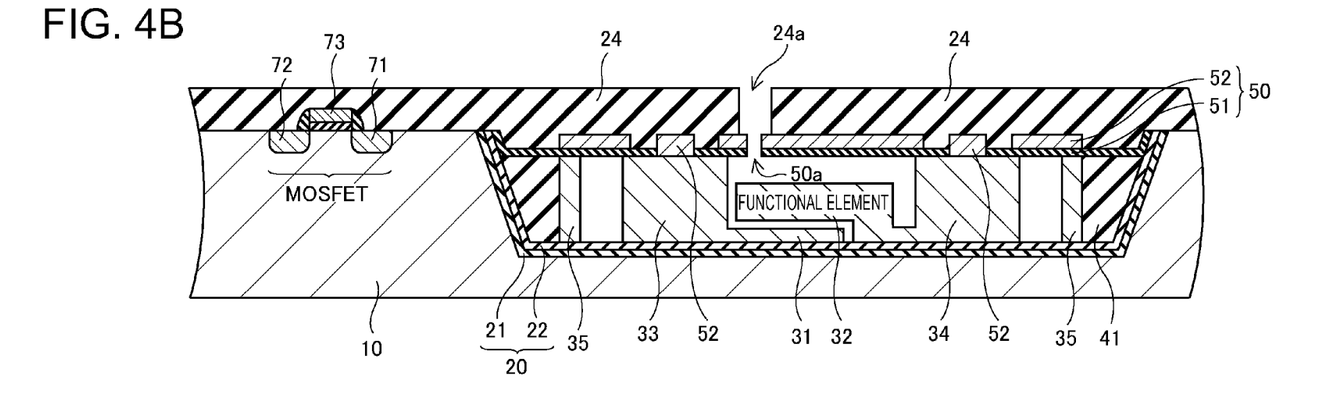

Next, as shown in FIG. 4B, a resist 24 that has an opening 24a in a position corresponding to the opening 50a of the first lid portion is provided, using a photolithography technique, on the surface of the semiconductor substrate 10 on which the MOS field-effect transistor and the like are formed. Furthermore, the insulating film of silicon dioxide ($SiO_2$) and the like in the cavity, that is to say, the sacrificial film is removed through wet etching (release etching) that uses hydrofluoric acid and the like as an etchant. Thereafter, the resist 24 is removed through asking and the like.

Figure 5A:
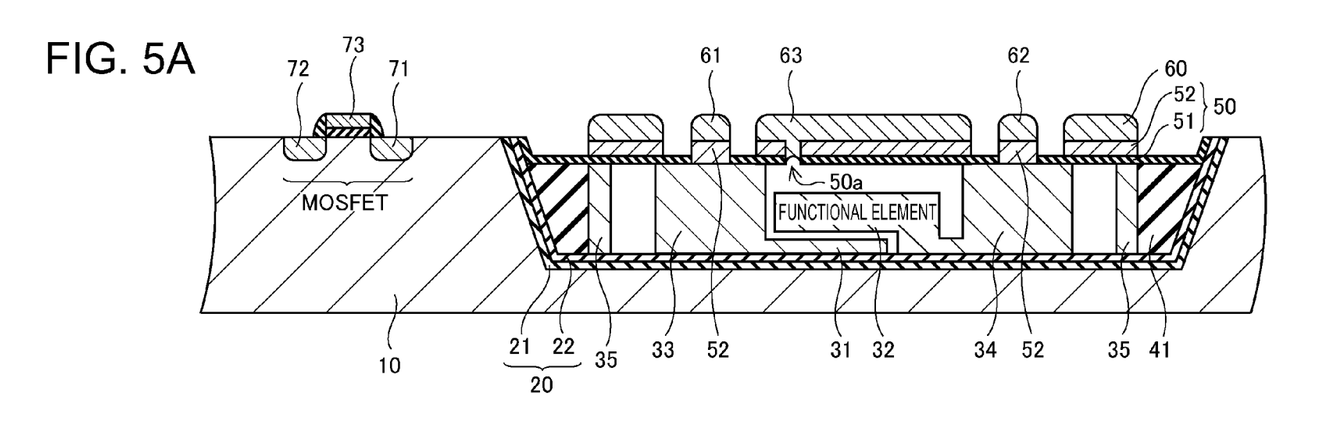
FIGS. 5A and 5B are cross-sectional views pertaining to manufacturing processes of the MEMS device according to the embodiment of the invention.

Next, a sealant of aluminum (Al) and the like is deposited on the surface of the first lid portion 50 through sputtering (a high vacuum film formation technique) in a vacuum chamber, and patterning is applied to the deposited sealant through dry etching that uses a resist. In this way, as shown in FIG. 5A, the second lid portion 60 is formed on the surface of the first lid portion 50 by the sealant of aluminum (Al) and the like.

The second lid portion 60 includes the intermediate conductive member 61, the intermediate conductive member 62 and the sealing portion 63. The intermediate conductive member 61 is electrically connected to a predetermined region of the external connection electrode 33 via the polysilicon film 52 and insulated from the other part of the second lid portion 60. The intermediate conductive member 62 is electrically connected to a predetermined region of the external connection electrode 34 via the polysilicon film 52 and insulated from the other part of the second lid portion 60. The sealing portion 63 seals the opening 50a of the first lid portion.

Figure 5B:
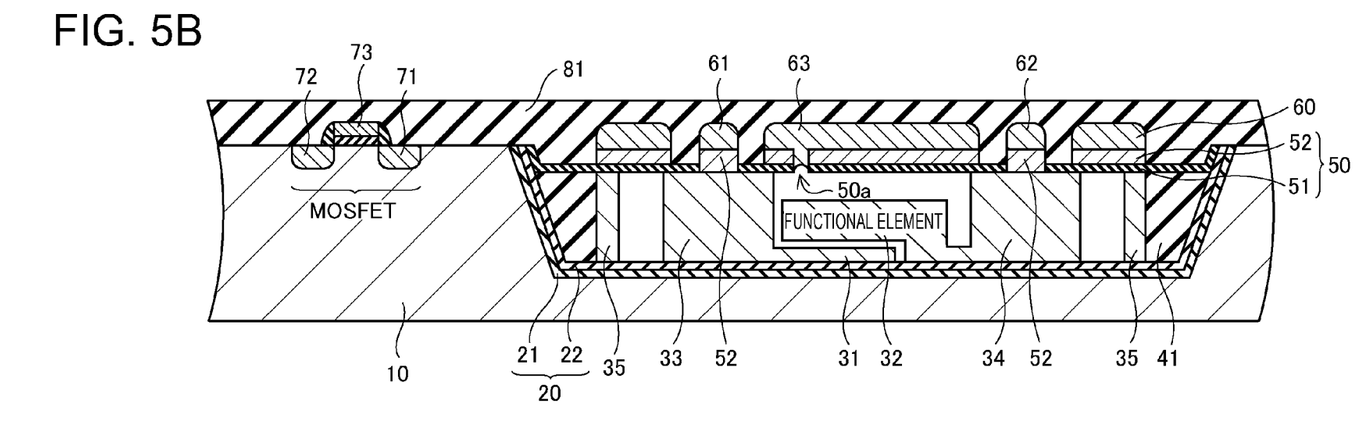

Next, the first insulating layer 81 is formed of silicon dioxide ($SiO_2$), BPSG, or the like. As shown in FIG. 5B, the first insulating layer 81 covers the main surface of the semiconductor substrate 10 on which the first lid portion 50, the second lid portion 60 and the semiconductor circuit element are formed. The first insulating layer 81 is in contact with the insulating film 51 and insulates the intermediate conductive members 61 and 62 of the second lid portion 60 from the sealing portion 63. Furthermore, it is preferable that the surface of the first insulating layer 81 be treated by CMP (Chemical Mechanical Polishing). In this way, the surface of the first insulating layer 81 is planarized, and formation of wiring on the first insulating layer 81 is made easy.

Figure 6A:
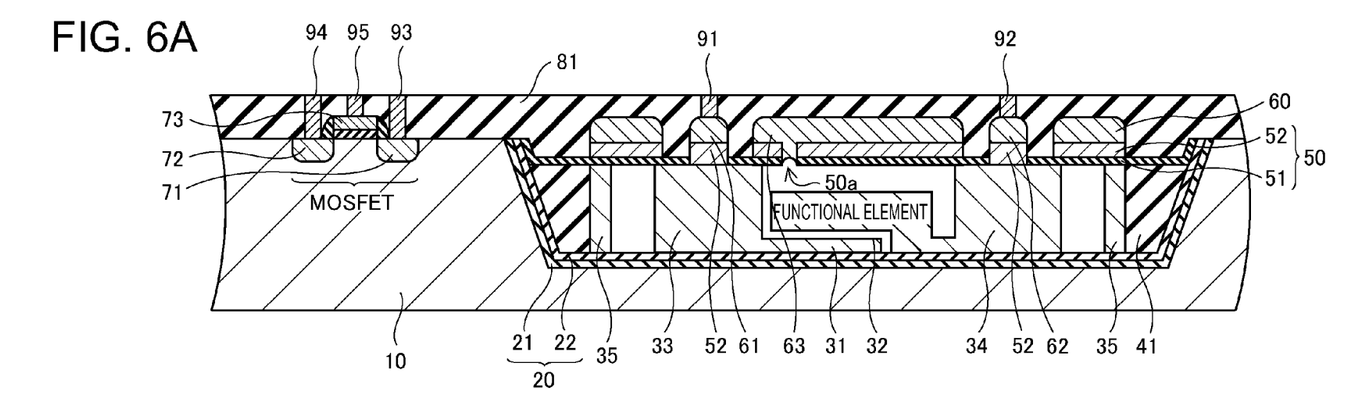
FIGS. 6A and 6B are cross-sectional views pertaining to manufacturing processes of the MEMS device according to the embodiment of the invention.

Next, the contact plugs 91 to 95 of tungsten (W) and the like are simultaneously formed. As shown in FIG. 6A, the contact plugs 91 and 92 penetrate the first insulating layer 81 and are electrically connected to the intermediate conductive members 61 and 62, respectively, whereas the contact plugs 93 to 95 penetrate the first insulating layer 81 and are electrically connected to the semiconductor circuit element.

Figure 6B:
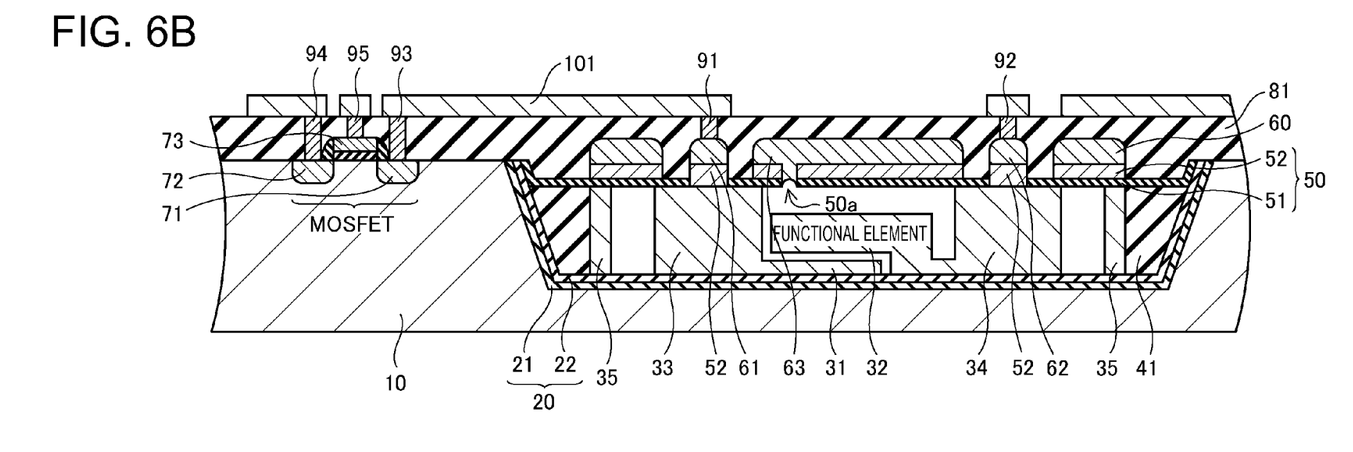

Next, as shown in FIG. 6B, the first wiring layer is formed on the surface of the first insulating layer 81 by aluminum (Al) and the like. Electrical connection to the contact plugs 91 to 95 is implemented on the first wiring layer. For example, the wiring 101 provided on the first wiring layer brings the contact plug 91 and the contact plug 93 into electrical connection to each other.

Furthermore, where necessary, the second wiring layer is formed via the second insulating layer 82, and the third wiring layer is formed via the third insulating layer 83 as shown in FIG. 1. For example, the, wiring 102 provided on the second wiring layer brings the contact plug 92 and the contact plug 94 into electrical connection to each other via the first wiring layer.

Accordingly, the external connection electrodes 33 and 34 of the resonator can be electrically connected to the semiconductor circuit element. In this way, a necessary number of wiring layers can be installed, using a standard semiconductor wafer process, on a layer(s) above the cavity that houses the resonator, similarly to a layer(s) above the semiconductor circuit element. Thereafter, the protection film 84 is formed on a surface of a topmost wiring layer.

While the above-described embodiment has discussed a MEMS device that includes a resonator as a functional element, the invention is by no means limited to the above-described embodiment. For example, the invention can be utilized in a MEMS device that includes a functional element such as a sensor and an actuator, and can be modified in many ways by a person of ordinary skill in the art within the technical ideas of the invention.

The entire disclosure of Japanese Patent Application No. 2014-055345, filed Mar. 18, 2014 is expressly incorporated by reference herein.

What is claimed is:

1. A MEMS device, comprising:
    a semiconductor substrate whose main surface has a first region in which a trench is formed and a second region in which an impurity diffusion region of a semiconductor circuit element is formed;
    a functional element that is disposed within a volume formed by the trench of the semiconductor substrate and includes a connection electrode;
    a structural member that is provided in the trench of the semiconductor substrate and forms a cavity surrounding the functional element;
    a lid portion that includes a conductive member electrically connected to the connection electrode and covers the cavity, the conductive member being insulated from another part of the lid portion;
    an insulating layer that covers the main surface of the semiconductor substrate provided with the lid portion and the semiconductor circuit element;
    a first electrode that penetrates the insulating layer and is electrically connected to the conductive member;
    a second electrode that penetrates the insulating layer and is electrically connected to the semiconductor circuit element; and
    wiring that is provided on a surface of the insulating layer and brings the first electrode and the second electrode into electrical connection to each other.

2. The MEMS device according to claim 1, wherein the surface of the insulating layer is treated by CMP (Chemical Mechanical Polishing).

3. The MEMS device according to claim 1, wherein in the trench of the semiconductor substrate, the functional element and the structural member are provided in a region that is lower than the main surface of the semiconductor substrate.

4. A method of manufacturing a MEMS device, the method comprising:
    (a) forming a trench in a first region of a main surface of a semiconductor substrate;
    (b) forming a functional element and a structural member within a volume formed by the trench of the semiconductor substrate, the functional element including a connection electrode, and the structural member forming a cavity surrounding the functional element;
    (c) forming a sacrificial film in the cavity;
    (d) forming a first lid portion in which an opening is formed and which covers a part of the cavity;
    (e) forming a semiconductor circuit element in a second region of the main surface of the semiconductor substrate;
    (f) removing the sacrificial film in the cavity through release etching;
    (g) forming, on a surface of the first lid portion, a second lid portion that includes a conductive member electrically connected to the connection electrode, the conductive member being insulated from another part of the second lid portion;
    (h) forming an insulating layer that covers the main surface of the semiconductor substrate on which the first lid portion, the second lid portion and the semiconductor circuit element are formed;
    (i) forming a first electrode and a second electrode, the first electrode penetrating the insulating layer and being electrically connected to the conductive member, and the second electrode penetrating the insulating layer and being electrically connected to the semiconductor circuit element; and
    (j) forming, on a surface of the insulating layer, wiring that brings the first electrode and the second electrode into electrical connection to each other.

* * * * *